United States Patent
Kuo

(10) Patent No.: US 7,170,578 B2
(45) Date of Patent: Jan. 30, 2007

(54) PATTERN CONTROL SYSTEM

(75) Inventor: Yang-Kuao Kuo, Thubei (CN)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 51 days.

(21) Appl. No.: 11/000,386

(22) Filed: Nov. 30, 2004

(65) Prior Publication Data

US 2006/0114444 A1   Jun. 1, 2006

(51) Int. Cl.
    *G03B 27/52*  (2006.01)
    *G03B 27/42*  (2006.01)
(52) U.S. Cl. .............................. 355/30; 355/53; 355/72
(58) Field of Classification Search ..................... None
    See application file for complete search history.

(56) References Cited

U.S. PATENT DOCUMENTS

| 6,200,432 B1 * | 3/2001 | Kobayashi et al. .... 204/192.12 |
| 6,613,487 B1 * | 9/2003 | Kim et al. ..................... 430/22 |
| 6,907,742 B2 * | 6/2005 | Kuo .............................. 62/62 |

* cited by examiner

*Primary Examiner*—D. Rutledge
(74) *Attorney, Agent, or Firm*—Tung & Associates

(57) ABSTRACT

A pattern control system for cooling a wafer prior to a photolithography exposure step. The pattern control system includes a wafer transfer pathway for transferring the wafer in a photolithography process and at least one cooling module provided along the wafer transfer pathway for cooling the wafer. Cooling of the wafers prevents thermal distortion of circuit pattern images formed in a photoresist layer on the wafer during a subsequent photolithography exposure process.

22 Claims, 5 Drawing Sheets

PATTERN CONTROL SYSTEM

FIELD OF THE INVENTION

The present invention relates to photolithography techniques used in the formation of integrated circuit (IC) patterns or dies on semiconductor wafer substrates. More particularly, the present invention relates to a pattern control system which prevents thermal distortion of patterns formed on a photoresist layer on a wafer by cooling the wafer prior to exposure of the wafer in photolithography.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

During the photolithography step of semiconductor production, light energy is applied through a reticle mask onto the photoresist material previously deposited on the wafer to define circuit patterns which will be etched in a subsequent processing step to define the circuits on the wafer. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

The circuit features on a reticle must be precisely fabricated since these features are transferred to the wafer to define the pattern of the circuits to be fabricated on the wafer. Thus, the quality of the reticle is important to produce high-quality imaging during submicron photolithography. If circuit pattern defects such as distortion and incorrect image placement on the reticle are not detected prior to the exposure step, these defects will be reproduced in the resist on the wafer. For this reason, once they are fabricated reticles are typically subjected to extensive automated testing for defects and particles.

Reticles are used in stepper systems and in step-and-scan systems, or scanners, which use a reduction lens to reduce overlay accuracy during circuit patterning. Steppers typically operate under a reduction ratio of 5:1 or 4:1, whereas scanners typically operate under a reduction ratio of 4:1. The small field exposure size on steppers and scanners facilitates precise control of tolerances during reticle alignment.

Steppers and scanners typically include a computer-controlled automatic alignment system which is contained in a pre-alignment unit and identifies alignment marks on the reticle. The reticle is mounted in a reticle stage and the wafer is supported on a wafer chuck provided on a wafer stage. An illumination system projects light through the alignment marks on the reticle and onto the wafer surface, respectively. Light detectors then optically detect the alignment marks on the reticle and marks on the wafer that are illuminated by the light. Laser infraredometry is used to measure the position of the wafer stage that holds the wafer chuck. Once obtained, the position data is fed into the system computer with a software interface to the electromechanical system used to facilitate the adjustments needed to properly align the wafer to the reticle.

The pre-alignment unit and exposure chamber of a scanner or stepper are typically component parts of a track system in which multiple wafers are transferred among the various stations of a photolithography process. In the track interface which is adjacent to the pre-alignment unit, multiple wafers are temporarily delayed in a track buffer cassette prior to being sequentially transferred into the pre-alignment unit for proper alignment of each wafer preparatory to exposure.

Patterning of the circuit pattern on the photoresist is one of the main factors that dictates product success or failure, and a number of factors can contribute to pattern instability. For example, it has been found that a major source of pattern instability is heat which emanates from a large heat source (WEE lamp) inside the track interface. This heat raises the temperature of the wafers delayed in the buffer cassette on the order of 1~2 degrees Celsius and causes the photoresist to expand, thus distorting the circuit pattern as it is transferrd from the reticle to the photoresist during exposure. Experiments have shown that with a fab temp. of 23.1 degrees Celsius, a track inteface temperature of 25 degrees Celsius, a track buffer cassette temperature of 25.5 degrees C and a scanner interior temperature of 23.0 degrees Celsius, adjustment of the track interface ventilation can control the temperature within approximately 0.5 degrees Celsius. However, it has been found that using such ventilation to control the track interface temperature is not workable because the track interface temperature ventilation uses air to facilitate cooling and this approach causes cooling temperature instability.

In further experiments, a wafer was coated with a bottom ARC (anti-reflective coating) layer, a middle layer of SEPR432 resist, and a top ARC layer in a diamond-shaped pattern having a length-to-width ratio of 30:1. In a first experiment, the wafer was delayed in a buffer cassette in the track interface of a scanner for 1 hour prior to exposure of the wafer. It was found that the pattern transferred from the reticle to the wafer during the first few wafer shots was seriously deformed and that the length of the pattern in middle shots differed. The pattern formed on the wafer in the last few shots was the same as the pattern defined in the reticle.

In a second experiment, a wafer was delayed outside the buffer cassette prior to exposure of the wafer. It was found that the pattern in the reticle and the pattern transferred to the photoresist on the wafer were the same. In a third experiment, the wafer was delayed in the cassette buffer, but in the pre-alignment unit, the wafer was sprayed with a gas having a temperature of 23 degrees C. In that case, the pattern in the reticle and the pattern transferred to the photoresist on the wafer were the same, as in the second experiment.

Accordingly, a pattern control system is needed which facilitates the cooling of wafers in a pre-alignment unit of a scanner or stepper prior to exposure of the wafers in order to preserve the integrity of a circuit pattern formed in a photoresist layer on the wafers.

An object of the present invention is to provide a novel pattern control system which enhances the quality of circuit pattern images formed on semiconductor wafers.

Another object of the present invention is to provide a novel pattern control system which ensures the integrity of a circuit pattern image photolithographically transferred from a reticle to a wafer.

Still another object of the present invention is to provide a novel pattern control system which prevents distorted circuit pattern images from being formed on a wafer during photolithography.

Yet another object of the present invention is to provide a novel pattern control system which enhances the yield of devices on a wafer.

A still further object of the present invention is to provide a novel pattern control system which may include a pre-alignment unit of a stepper or scanner and a source of cooling gas provided in fluid communication with the pre-alignment unit for cooling a wafer or wafers prior to photolithographic exposure.

Another object of the present invention is to provide a novel pattern control system which may utilize a gas distribution plate to disperse a cooling gas into thermal contact with a wafer to cool the wafer prior to photolithographic exposure.

Still another object of the present invention is to provide a novel pattern control system which may utilize a cooling fluid to cool a wafer chuck and a wafer resting on the chuck by conduction prior to photolithographic exposure of the wafer.

Yet another object of the present invention is to provide a novel method of enhancing the quality of circuit pattern images formed on a wafer during photolithography.

SUMMARY OF THE INVENTION

In accordance with these and other objects and advantages, the present invention is generally directed to a novel pattern control system which includes at least one cooling module typically provided in a scanner or stepper or other location along a wafer transfer pathway to cool semiconductor wafers prior to photolithographic exposure of the wafers. Such cooling of the wafers prevents thermal distortion of circuit pattern images formed in a photoresist layer on the wafers during a subsequent photolithography exposure process. In one embodiment, the pattern control system includes at least one cooling module which is installed in a pre-alignment unit of a scanner or stepper. The pre-alignment unit typically includes a rotation unit for positioning a wafer for photolithography, sensor elements for sensing positions of the wafer, and a cooling gas source provided in fluid communication with the pre-alignment unit for introducing a cooling gas, such as nitrogen or clean dry air (CDA), into the pre-alignment unit. The wafer is initially transferred from a buffer cassette contained in a track interface adjacent to the pre-alignment unit, after which the wafer is subjected to the pre-alignment process. Simultaneously, the cooling gas is introduced into the pre-alignment unit to cool the wafer. After completion of the pre-alignment process, the cooling gas is evacuated from the pre-alignment unit and the wafer is then subjected to a photolithography exposure step.

In another embodiment, the pattern control system includes at least one cooling module which is provided in a pre-alignment unit in which wafers are pre-aligned prior to photolithographic exposure. The cooling module includes a cooling chuck provided in the pre-alignment unit for supporting a wafer as the wafer is pre-aligned. A source of cooling fluid is provided in fluid communication with the cooling chuck to distribute a cooling fluid through the cooling chuck and cool the wafer by conduction prior to photolithographic exposure of the wafer.

The present invention further includes a novel method of enhancing the quality of circuit pattern images formed on a wafer during photolithography. The method includes providing a wafer, subjecting the wafer to a photolithography pre-alignment process and simultaneously cooling the wafer.

BRIEF DESCRIPTION OF THE DRAWINGS

The invention will now be described, by way of example, with reference to the accompanying drawings, in which.

DETAILED DESCRIPTION OF THE INVENTION

Figure 1:
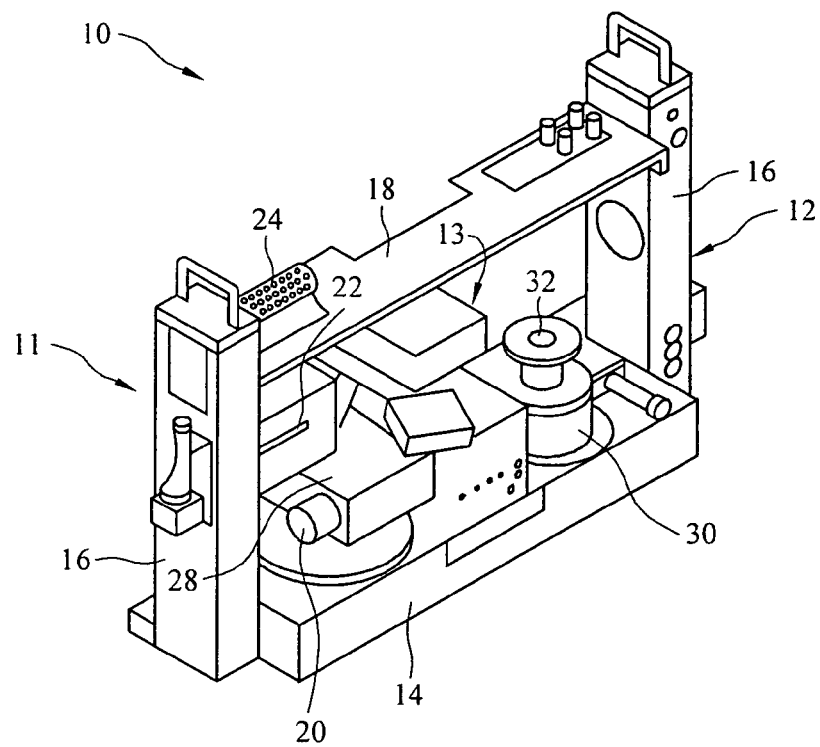
FIG. 1 is a perspective view of an illustrative embodiment of the pattern control system of the present invention.

The present invention contemplates a novel pattern control system which may be provided in a photolithography scanner or stepper to cool semiconductor wafers and prevent thermal distortion of circuit pattern images formed in a photoresist layer on the wafers during a subsequent photolithography process. In a first embodiment, the pattern control system includes at least one cooling module which is provided in a pre-alignment unit of a scanner or stepper such as an ASML scanner, for example. However, the cooling module or modules can be provided at other positions in a wafer transfer path along which wafers are transferred typically prior to photolithography. A rotation unit having a wafer positioning chuck and sensor elements to facilitate positioning of a wafer preparatory to photolithography is provided in the pre-alignment unit. Each cooling module includes a cooling gas source which is provided in fluid communication with the pre-alignment unit for introducing a cooling gas, such as nitrogen or clean dry air (CDA), for example, into the pre-alignment unit.

In operation of the pattern control system, the wafer is initially delayed with other wafers in a buffer cassette in a track interface adjacent to the pre-alignment unit. The track interface includes a heat source (WEE lamp) which tends to raise the temperature of the wafers delayed in the buffer cassette. Each wafer is individually transferred from the buffer cassette into the pre-alignment unit, after which the wafer is subjected to a pre-alignment process. As the wafer is pre-aligned for photolithography, the cooling gas is introduced into the pre-alignment unit to cool the wafer. After completion of the pre-alignment process, the cooling gas is evacuated from the pre-alignment unit. The wafer is then subjected to a photolithography exposure step in which a circuit pattern image is transferred from a reticle onto a photoresist layer coated on the wafer.

In another embodiment, the pattern control system includes at least one cooling module provided in a pre-alignment unit in which individual wafers are sequentially pre-aligned prior to photolithographic exposure. The cooling module includes a cooling chuck provided in the pre-alignment unit for supporting a wafer as the wafer is pre-aligned. A source of cooling fluid, which may be a liquid or gas, is provided in fluid communication with the cooling chuck. The cooling fluid is distributed from the cooling fluid source and through the cooling chuck to cool the wafer by conduction prior to photolithographic exposure of the wafer.

The present invention further includes a novel method of enhancing the quality of circuit pattern images formed on a wafer during photolithography. According to the method, a wafer on which is coated a photoresist layer is typically subjected to a photolithography pre-alignment process and simultaneously cooled. Cooling of the wafer prior to photolithographic exposure prevents or at least minimizes thermal distortion of circuit pattern images transferred from a reticle onto the wafer.

Figure 2:
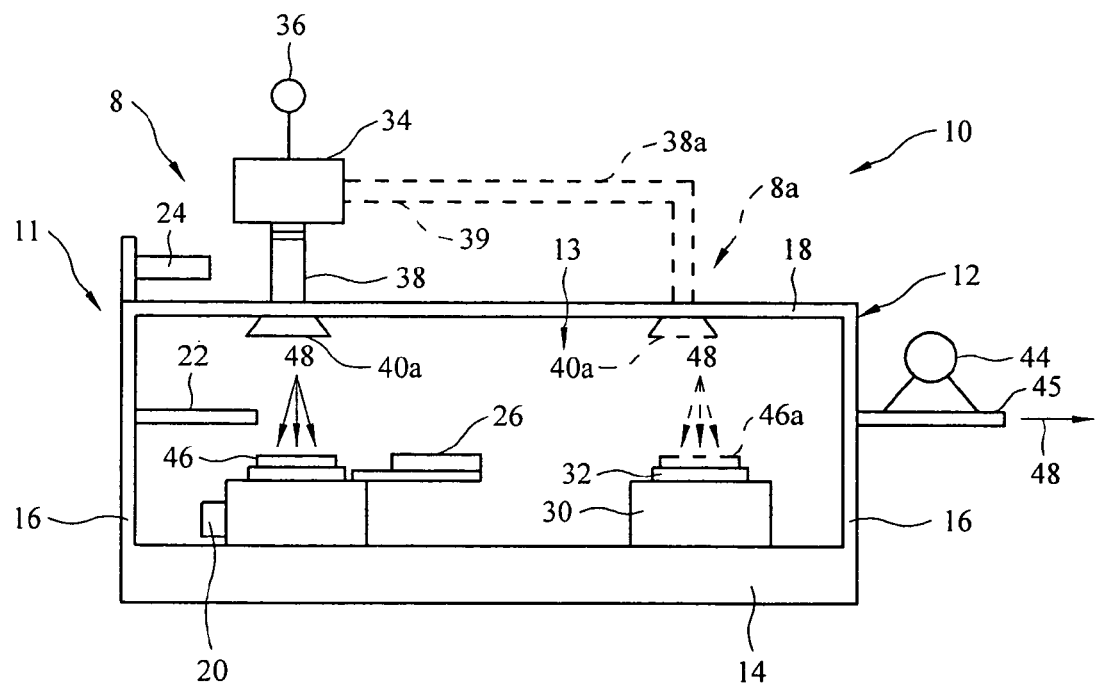
FIG. 2 is a side view, partially schematic, of a first illustrative embodiment of the pattern control system.
Figure 3:
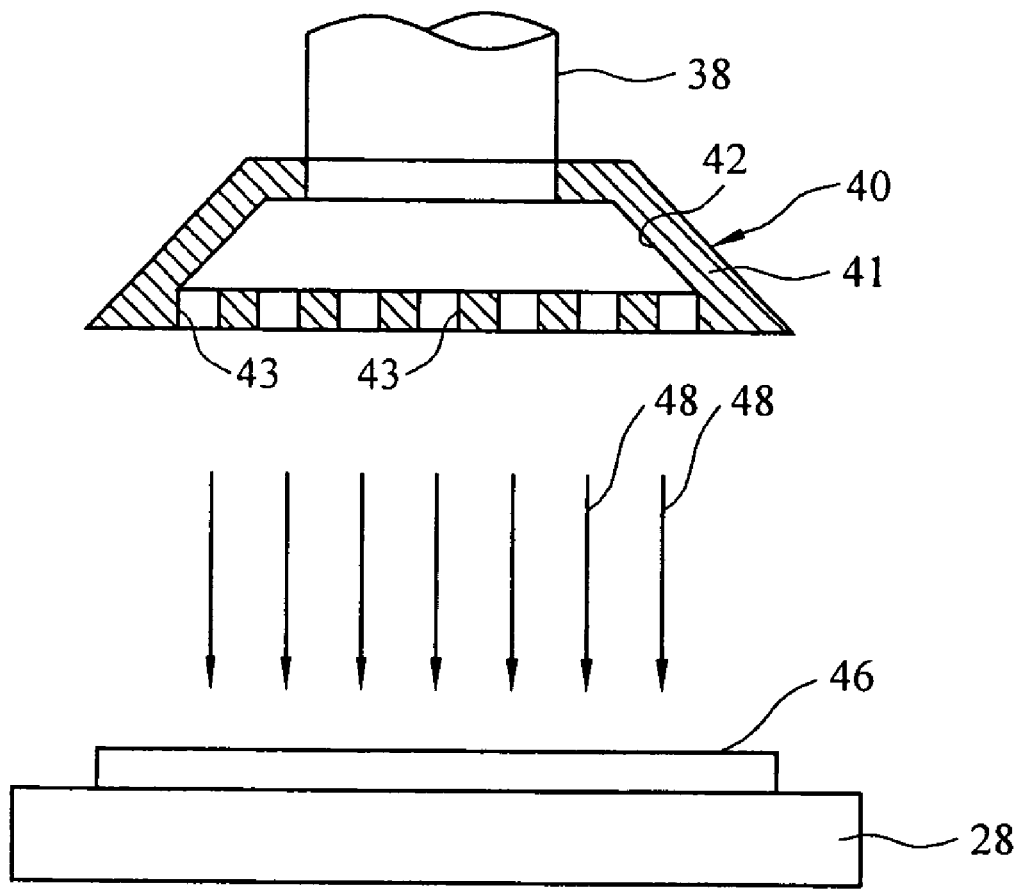
FIG. 3 is a cross-section of a gas distribution plate used to disperse a cooling gas against a wafer in implementation of the pattern control system shown in FIG. 2.

Referring initially to FIGS. 1–3, an illustrative embodiment of the pattern control system of the present invention is generally indicated by reference numeral 10. The pattern control system 10 is typically installed in a pre-alignment unit 11 which is typically a component part of a stepper or scanner (not shown) such as an ASML scanner, for example. The pre-alignmetn unit 11 has an elongated frame 12. The frame 12 typically includes a base 14, upward-standing sides 16 and a top 18. The pre-alignment unit 11 is typically included in an enclosed track system (not shown) in which a track interface (not shown) interfaces with the pre-alignment unit 11. Therefore, the pre-alignment unit 11 is typically an enclosed system wherein the sides 16 and top 18 of the frame 12 define a unit interior 13 that is separated from the exterior environment. The track interface is designed to store buffer cassettes (not shown) in which multiple wafers (not shown) are delayed prior to entry into the pre-alignment unit 11. The pre-alignment unit 11 aligns individual wafers 46 prior to photolithographic exposure of the wafers 46, as will be hereinafter further described.

As shown in FIGS. 1 and 2, a rotation unit 20 is provided in the unit interior 13 of the pre-alignment unit 11. A wafer positioning chuck 28 is provided in the pre-alignment unit 11 for supporting and positioning a wafer 46 thereon prior to photolithographic exposure of the wafer 46. A mark sensor 22 and an edge sensor 26 are included in the unit interior 13 for sensing the positions of alignment marks (not shown) and an edge, respectively, of the wafer 46. A mark illuminator 24 is typically provided on the frame 12 to illuminate the alignment marks on the wafer 46. A discharge unit 30 is provided in the unit interior 13, in spaced-apart relationship to the rotation unit 20 and includes a wafer discharge support 32 for receiving and supporting a wafer 46a after photolithographic exposure. The wafer 46a is delayed on the wafer discharge support 32 until transfer from the pre-alignment unit 11 to the next processing station in the semiconductor fabrication sequence.

The pattern control system 10 includes at least one cooling module 8 provided on the pre-alignment unit 11. Each cooling module 8 includes a cooling gas source 34, which may contain a compressed cooling gas 48 such as nitrogen or clean dry air (CDA), for example. The cooling gas source 34 is provided in fluid communication with the unit interior 13, typically through a gas conduit 38. A gas filter 39 may be provided in the gas conduit 38 for filtering particles from the cooling gas 48 as the cooling gas 48 flows therethrough. The cooling gas source 34 is fitted with a temperature controller 36 which facilitates temperature control of the cooling gas 48.

A gas distribution plate or "showerhead" 40 may be provided in fluid communication with the gas conduit 38, in the unit interior 13. The gas distribution plate 40 may be positioned directly above the wafer positioning chuck 28 or in any other suitable location in the unit interior 13. A second cooling module 8a may include a second gas distribution plate 40a (shown in phantom), typically connected to the cooling gas source 34 through a gas conduit 38a, or alternatively, to a separate cooling gas source (not shown). The second gas distribution plate 40a is provided in the unit interior 13, above or in the general vicinity of the discharge wafer support 32. As shown in FIG. 3, the gas distribution plate 40 typically includes a body 41 having an interior 42 which communicates with the gas conduit 38. Multiple gas distribution openings 43 are provided in the body 41. An exhaust conduit 45, which is fitted with an exhaust pump 44, extends from the unit interior 13 to evacuate the cooling gas 48 from the unit interior 13 after pre-alignment, as will be hereinafter further described.

In operation of the pattern control system 10, multiple wafers (not shown) having a photoresist layer deposited thereon are stored in a buffer cassette (not shown) inside a track interface (not shown) which interfaces with the pre-alignment unit 11. A heat source (not shown), which is a WEE (wafer edge exposure) lamp, is provided inside the track interface. This heat source tends to raise the temperature of the wafers delayed in the buffer cassette on the order of typically about 1~2 degrees Celsius prior to transfer of the individual wafers 46 from the buffer cassette into the pre-alignment unit 11.

Each wafer 46 is individually transferred from the buffer cassette in the track interface, into the unit interior 13 typically by a transfer robot or other transfer mechanism (not shown). The wafer 46 is placed on the wafer positioning chuck 28, after which the pre-alignment process, which may be conventional, is carried out. During the pre-alignment process, the mark illuminator 24 illuminates alignment marks (not shown) on the wafer 46 while the mark sensor 22 senses the positions of the alignment marks. The edge sensor 26 senses the position of the wafer edge. The rotation unit 20 causes the wafer positioning chuck 28 to rotate the wafer 46 until the alignment marks on the wafer 46 are properly oriented for photolithographic exposure of the wafer 46. Throughout pre-alignment and exposure of the wafer 46, a wafer 46a which was previously subjected to pre-alignment and photolithographic exposure may be placed on the discharge wafer support 32 of the discharge unit 30 to await transfer from the pre-alignment unit 11. Pre-alignment of the wafer 46 is carried out over a time period of typically about 4~60 seconds.

According to the present invention, during pre-alignment of the wafer 46, the wafer 46 is simultaneously subjected to a cooling process. Accordingly, the cooling gas 48, which may be nitrogen gas or clean dry air (CDA), for example, is initially contained in the cooling gas source 34. The temperature controller 36 is used to set the temperature of the cooling gas 48 at a desired cooling temperature. Under typical processing conditions, the temperature of the wafer 46 may be up to about 25 degrees C. upon transfer into the pre-alignment unit 11. In that case, the temperature of the cooling gas 48 is set to typically about 22.5~23 degrees Celsius to cool the wafer 46 to a temperature of about 23 degrees Celsius.

The cooling gas 48 is distributed from the cooling gas source 34; through the gas conduit 38 and gas distribution plate 40, respectively, of the cooling module 8a; and into the unit interior 13, where the cooling gas 48 contacts the wafer 46. As shown in FIG. 3, the gas distribution plate 40 typically directs the cooling gas 48 directly against the surface of the wafer 46, in perpendicular relationship to the wafer 46. Accordingly, over a time period of typically about 40~60 seconds, the cooling gas 48 cools the wafer 46 to about 23 degrees Celsius. After the pre-alignment step is carried out, the wafer 46 is subjected to photolithographic exposure. The wafer 46 is then transferred to the discharge wafer support 32 to await transfer from the pre-alignment unit 11. Such cooling of the wafer 46 during the pre-alignment process prevents thermal distortion of circuit pattern images transferred from a reticle (not shown) onto the wafer during exposure. After pre-alignment and cooling of the wafer 46, the cooling gas 48 is evacuated from the unit interior 13 through the exhaust conduit 45, by operation of the pump 44. As the wafer 46 is subjected to the pre-alignment and cooling processes, a wafer 46a which was previously subjected to alignment and exposure and is supported on the discharge wafer support 32 may be simultaneously subjected to cooling by cooling gas 48 distributed from the cooling gas source 34; through the conduit 38a and gas distribution plate 40a, respectively, of the cooling module 8a; and against the wafer 46a.

Figure 4:
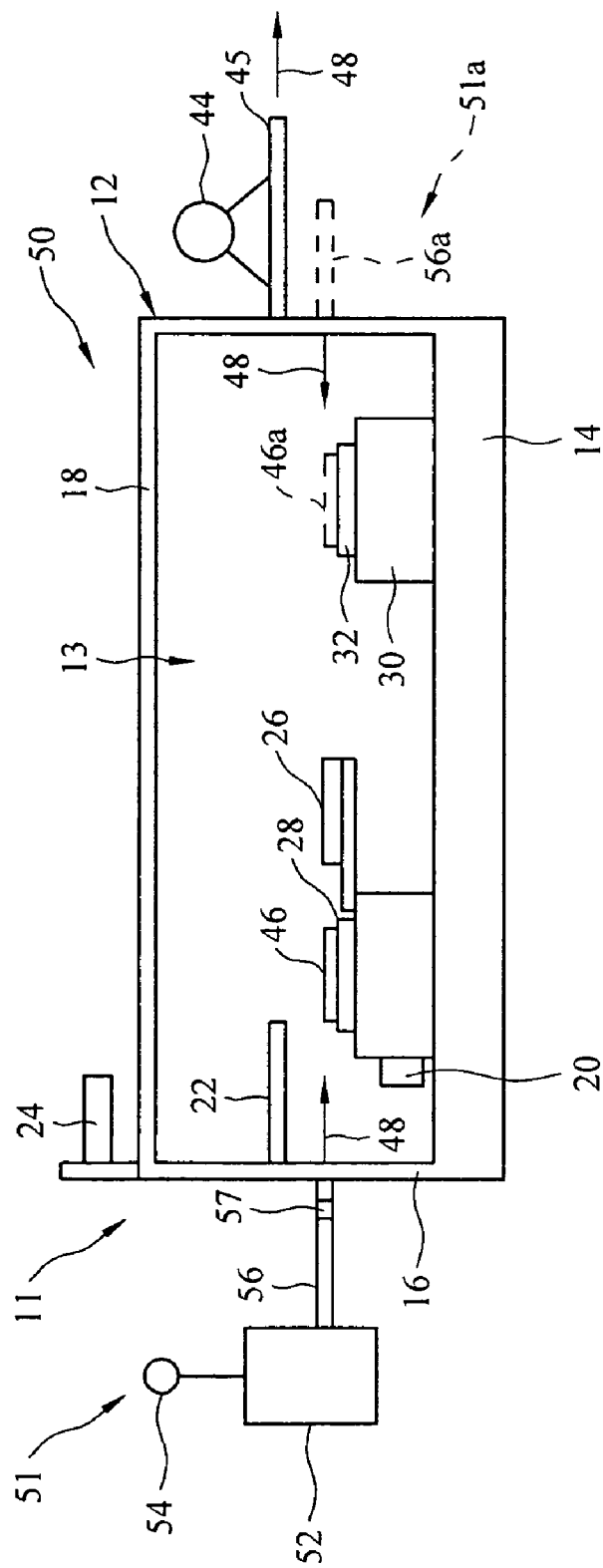
FIG. 4 is a side view, partially schematic, of a second illustrative embodiment of the pattern control system.

Referring next to FIG. 4, another illustrative embodiment of the pattern control system of the present invention is generally indicated by reference numeral 50. The pattern control system 50 includes at least one cooling module 51 having a cooling gas source 52 which contains a source of cooling gas 48 such as nitrogen or clean dry air (CDA), for example. A gas conduit 56 connects the cooling gas source 52 to the unit interior 13 of the pre-alignment unit 11. A gas filter 57 may be provided in the gas conduit 56 for removing particles from the cooling gas 48 as the cooling gas 48 flows therethrough. The gas conduit 56 may enter the unit interior 13 through the bottom 14, side 16 (as shown) or top 18 of the frame 12 at any desired location, although it is preferred that the gas conduit 56 enter the unit interior 13 at a location which is adjacent to or in the general vicinity of the wafer positioning chuck 28. A second cooling module 51a having a gas conduit 56a may be connected to the cooling gas source 52 or to a separate cooling gas source (not shown) to introduce cooling gas 48 into the unit interior 13 adjacent to or in the general vicinity of the discharge wafer support 32. The cooling gas source 52 is fitted with a temperature controller 54 to control the temperature of the cooling gas 48. Operation of the pattern control system 50 is as heretofore described with respect to the pattern control system 10 of FIG. 2, except the cooling gas 48 typically contacts the wafer 46 from a direction which is parallel to the plane of the wafer surface.

Figure 5:
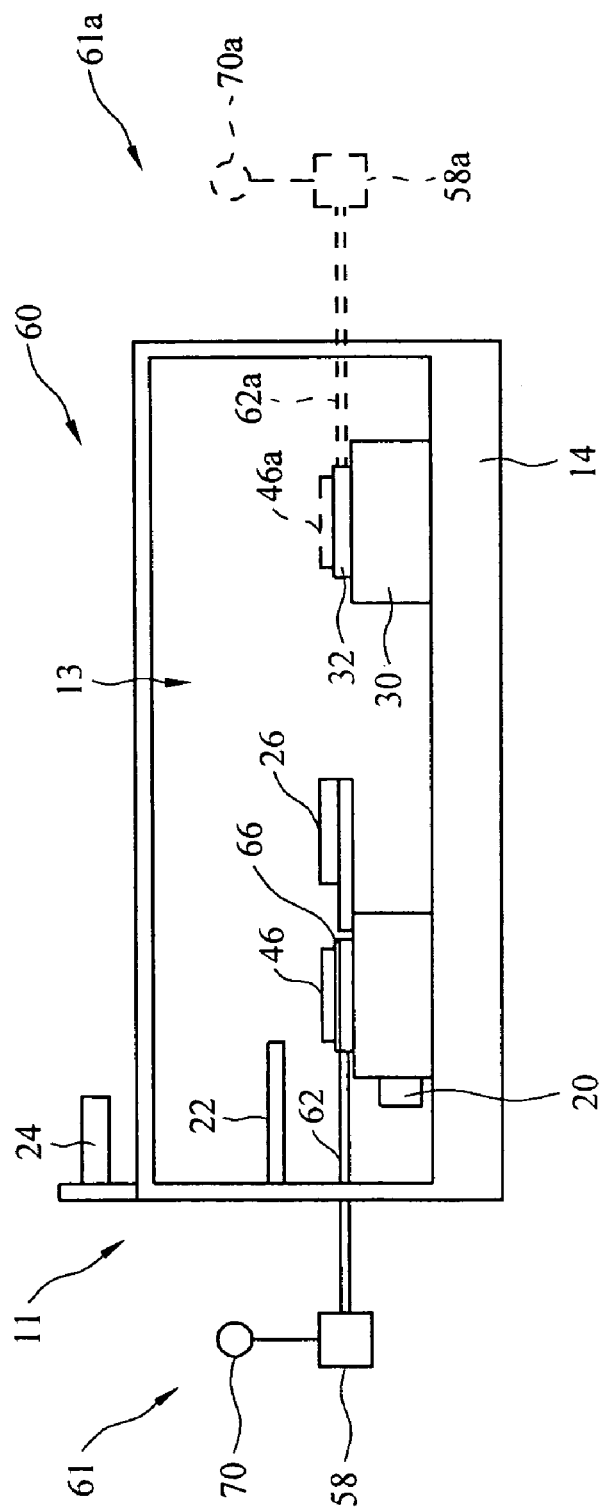
FIG. 5 is a side view, partially schematic, of a third illustrative embodiment of the pattern control system.
Figure 6:
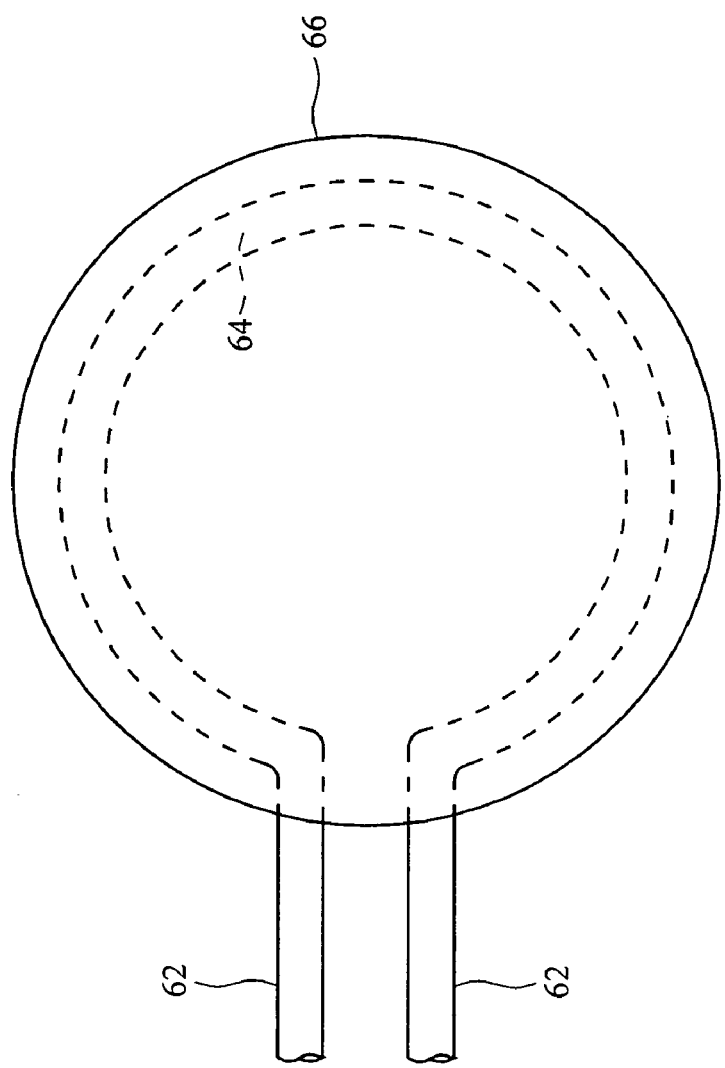
FIG. 6 is a top view, partially in section, of a cooling chuck used to cool wafers in implementation of the pattern control system shown in FIG. 5.
Figure 6:
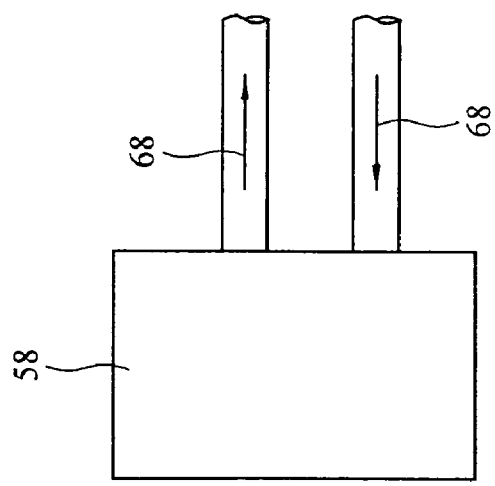

Referring next to FIGS. 5 and 6, still another illustrative embodiment of the pattern control system of the present invention is generally indicated by reference numeral 60. The pattern control system 60 includes a cooling module 61 having a cooling fluid source 58 which contains a supply of cooling fluid 68 (either a gas or a liquid), as shown in FIG. 6. The cooling fluid source 58 is provided with a temperature controller 70 for controlling the temperature of the cooling fluid 68. A cooling chuck 66 is provided on the rotation unit 20 inside the unit interior 13. As shown in FIG. 6, the cooling chuck 66 is connected to the cooling fluid source 58 through a distribution conduit 62. The distribution conduit 62 is confluently connected to a circulation conduit 64 which extends through the interior of the cooling chuck 66.

In the pattern control system 60, the discharge wafer support 32 may be adapted to include a second cooling module 61a in which the discharge wafer support 32 includes a circulation conduit 64, as heretofore described with respect to the cooling chuck 66 shown in FIG. 6. In that case, a cooling fluid source 58a, having a temperature controller 70a, may be connected to the discharge wafer support 32 for cooling of a wafer 46a thereon prior to transfer of the wafer 46a from the pre-alignment unit 11. Alternatively, the discharge wafer support 32 may be connected to the cooling fluid source 58 which cools the cooling chuck 66.

In operation of the pattern control system 60, the temperature controller 70 is used to maintain the cooling fluid 68 at about 22.5~23 degrees Celsius. During pre-alignment of the wafer 46 on the cooling chuck 66, the cooling fluid 68 is circulated from the cooling fluid source 58; through the distribution conduit 62; through the circulation conduit 64 of the cooling chuck 66; and back to the cooling fluid source 58 through the distribution conduit 62, respectively. By conduction, the cooling fluid 68 reduces the temperature of the cooling chuck 66 and the cooling chuck 66 reduces the temperature of the wafer 46 to about 23 degrees Celsius. Upon completion of the pre-alignment process, circulation of the cooling fluid 68 through the circulation conduit 64 is stopped. Accordingly, upon subsequent photolithographic exposure of the wafer 46, the integrity of the circuit pattern image transferred from the reticle (not shown) to the photoresist layer on the wafer 46 is preserved, thus reducing or eliminating thermal distortion of the circuit pattern image.

While the preferred embodiments of the invention have been described above, it will be recognized and understood that modifications can be made in the invention and the appended claims are intended to cover all such modifications which may fall within the spirit and scope of the invention.

What is claimed is:

1. A pattern control system for cooling a wafer prior to a photolithography exposure step to reduce thermal distortion of pattern transfer to photoresist in said photolithography exposure step, comprising:
   a wafer transfer pathway comprising a wafer heating source, said wafer transfer pathway for transferring the wafer onto a wafer positioning chuck for pre-alignment and exposure in a photolithography process; and
   at least one cooling module provided for cooling the wafer while on said wafer positioning chuck.

2. The pattern control system of claim 1 wherein said at least one cooling module comprises a cooling gas source for containing a cooling gas and a gas conduit extending from said cooling gas source for generally directing the cooling gas into contact with the wafer.

3. The pattern control system of claim 2 wherein said cooling gas source comprises a source of nitrogen gas.

4. The pattern control system of claim 2 wherein said cooling gas source comprises a source of clean dry air.

5. The pattern control system of claim 2 further comprising a gas distribution plate carried by said gas conduit.

6. The pattern control system of claim 2 further comprising a temperature controller provided in thermal contact with said cooling gas source for cooling the cooling gas.

7. The pattern control system of claim 1 wherein said at least one cooling module comprises said wafer positioning chuck and a cooling fluid source provided in fluid communication with said wafer positioning chuck for distributing a cooling fluid through said wafer positioning chuck.

8. The pattern control system of claim 7 further comprising a temperature controller provided in thermal contact with said cooling fluid source for cooling the cooling gas.

9. A pattern control system for cooling a wafer prior to a photolithography exposure step to reduce thermal distortion of pattern transfer to photoresist in said photolithography exposure step, comprising:
   a pre-alignment unit for pre-aligning the wafer prior to the photolithography exposure step, said pre-alignment unit comprising a wafer positioning chuck for pre-aligning said wafer and exposing a photoresist on said wafer while said wafer is on said water positioning chuck; and
   at least one cooling module provided in said pre-alignment unit for cooling the wafer upon transfer of said wafer onto said wafer positioning chuck.

10. The pattern control system of claim 9 wherein said at least one cooling module comprises a cooling gas source for containing a cooling gas and a gas conduit extending from said cooling gas source for generally directing the cooling gas into contact with the wafer.

11. The pattern control system of claim 10 wherein said cooling gas source comprises a source of nitrogen gas.

12. The pattern control system of claim 10 wherein said cooling gas source comprises a source of clean dry air.

13. The pattern control system of claim 10 further comprising a gas distribution plate carried by said gas conduit.

14. The pattern control system of claim 10 further comprising a temperature controller provided in thermal contact with said cooling gas source for cooling the cooling gas.

15. The pattern control system of claim 9 wherein said at least one cooling module comprises said wafer positioning chuck and a cooling fluid source provided in fluid communication with said said wafer positioning chuck for distributing said cooling fluid through said said wafer positioning chuck.

16. The pattern control system of claim 15 further comprising a temperature controller provided in thermal contact with said cooling fluid source for cooling the cooling gas.

17. A method of enhancing quality of circuit pattern images formed on a wafer during photolithography by reducing thermal distortion of pattern transfer to photoresist in said photolithography exposure step, comprising:
   providing a wafer on a wafer positioning chuck, said wafer heated above a desirable temperature in said photolithography exposure step prior to being placed on said wafer positioning chuck;
   subjecting said wafer to a photolithography pre-alignment process comprising locating wafer alignment marks while said wafer is on said wafer positioning chuck;
   cooling said wafer during said photolithography pre-alignment process while on said wafer positioning chuck; and
   subjecting said wafer to said photolithography exposure step while on said wafer positioning chuck.

18. The method of claim 17 wherein said cooling said wafer comprises providing a cooling gas and directing said cooling gas against said wafer.

19. The method of claim 18 wherein said cooling gas comprises nitrogen gas.

20. The method of claim 18 wherein said cooling gas comprises clean dry air.

21. The method of claim 18 further comprising maintaining said cooling gas at a temperature of about 23 degrees Celsius prior to said directing said cooling gas against said wafer.

22. The method of claim 18 wherein said cooling said wafer comprises distributing a cooling fluid through said wafer positioning chuck.

* * * * *